United States Patent [19]

Bacher

[11] 4,153,885

[45] May 8, 1979

[54] MICROWAVE EQUALIZER WITH COAXIAL CABLE RESONANT STUBS

[76] Inventor: Helmut Bacher, 3301 Homestead Rd., Santa Clara, Calif. 95051

[21] Appl. No.: 799,669

[22] Filed: May 23, 1977

[51] Int. Cl.$^{2}$ .......................... H01P 1/20; H01P 1/22; H03H 7/14

[52] U.S. Cl. .................................... 333/28 R; 333/245

[58] Field of Search ................. 333/28 R, 81 A, 97 R

[56] References Cited

U.S. PATENT DOCUMENTS

| | | | |
|---|---|---|---|
| 3,027,514 | 3/1962 | Bird et al. | 333/97 R X |
| 3,648,200 | 3/1972 | Harrison et al. | 333/81 R X |

OTHER PUBLICATIONS

Drawing #OL-121, Equalizer, MMI, 1972, Cascade Microwave Inc., Seattle, Washington, 98188.

*Primary Examiner*—Paul L. Gensler

*Attorney, Agent, or Firm*—Graybeal, Barnard & Uhlir

[57] ABSTRACT

An improved, more compact microwave equalizer is provided by utilizing a length of coaxial transmission line to which at least a pair of relatively small diameter, flexible, coaxial cable resonant stubs are coupled through film type impedance means. Each coaxial cable stub is disposed adjacent the outer conductor of the transmission line, for compactness, and the length of each stub is minimized by use of high dielectric constant material therein. By shortening the length of each resonant stub and by shunting a capacitor across each resonant stub, the frequencies of the upper and lower band edges of the equalizer's attenuation curve are spread apart, while simultaneously providing the desired operating frequency band. Slots and/or an annular recess provided in the relatively thick outer conductor of the transmission line receive the stubs and the retaining apparatus for the film type impedance means. The characteristic impedance of the equalizer is maintained relatively constant throughout its length by providing air dielectric in the region of the structure in the internal diameter of the outer conductor portion associated with said annular recess. The voltage standing wave ratio of the equalizer may be improved by providing a slightly reduced diameter, and a corresponding air gap in the surrounding dielectric material, for a portion of the central series conductor of the transmission line which is located between the coupling points of the stubs.

13 Claims, 21 Drawing Figures

FIG. 1
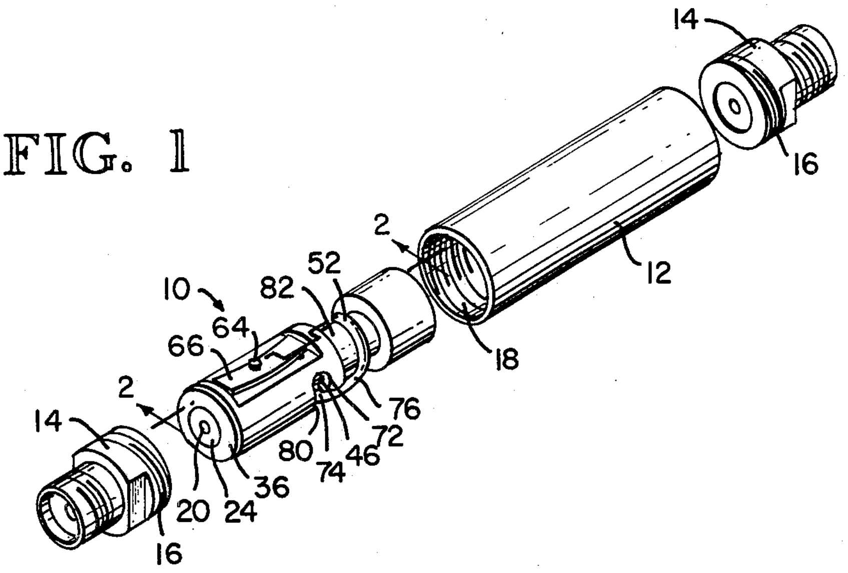
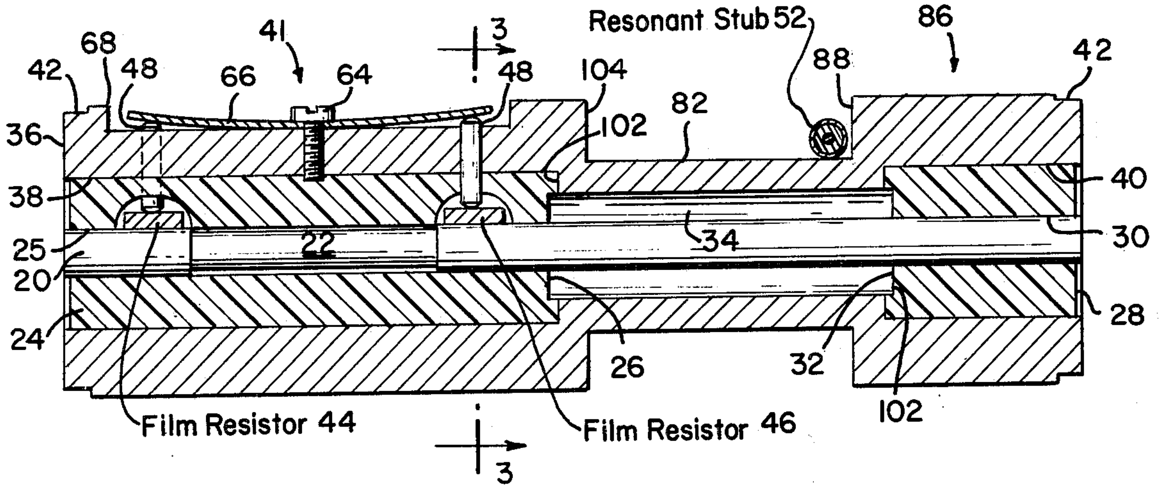
FIG. 2
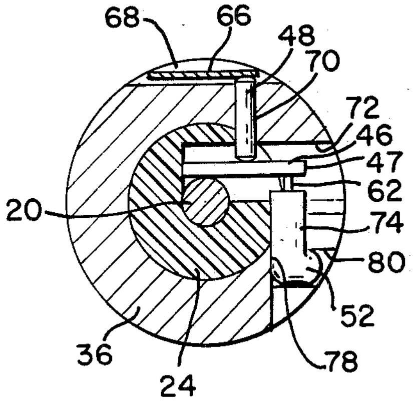
FIG. 3

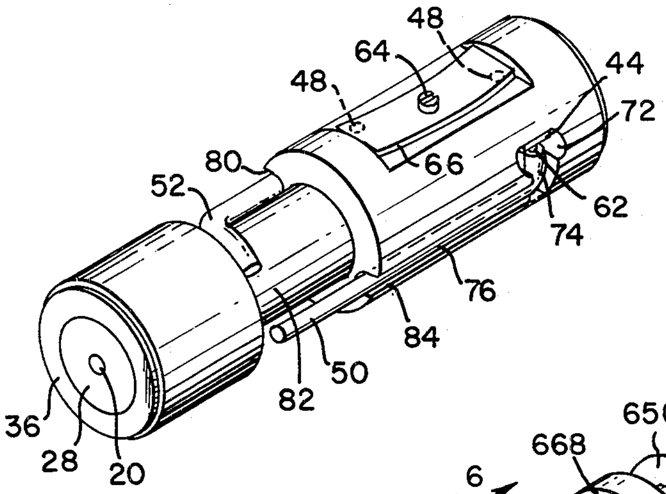
FIG. 4
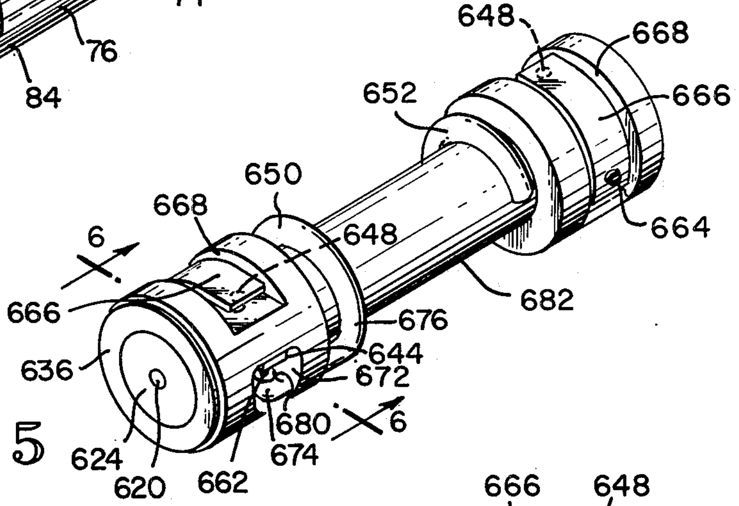
FIG. 5
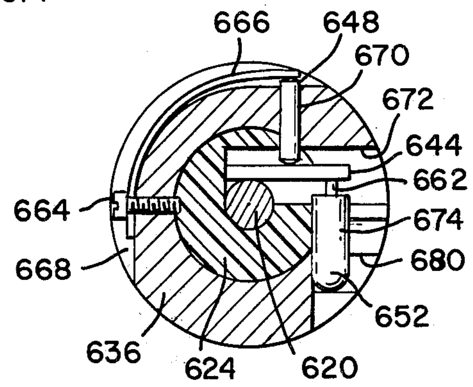
FIG. 6
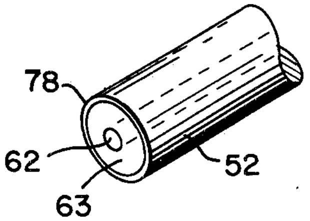
FIG. 7
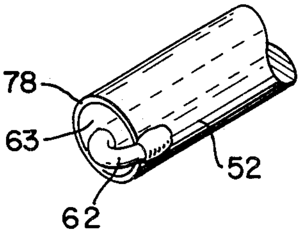
FIG. 8
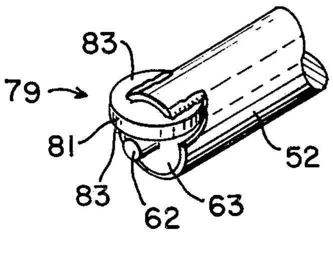
FIG. 9
FIG. 10
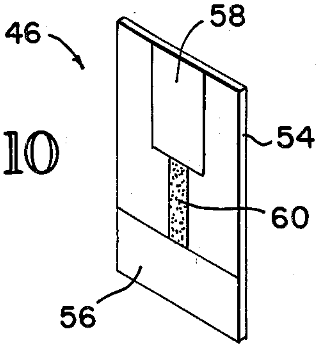

FIG. 14
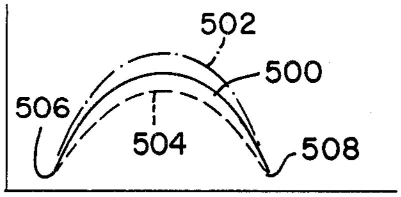
FIG. 15
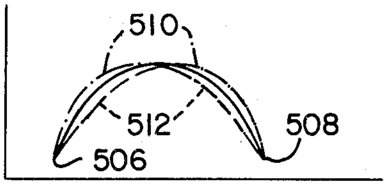
FIG. 16
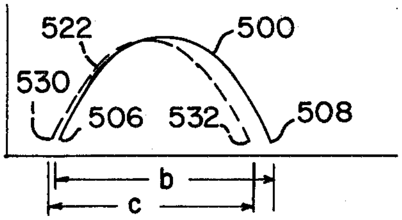
FIG. 17
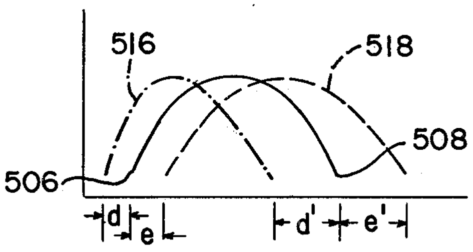
FIG. 18
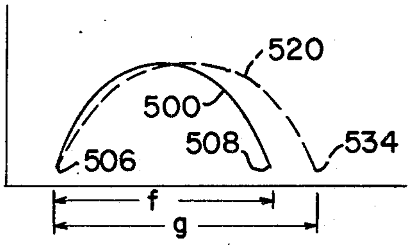
FIG. 20
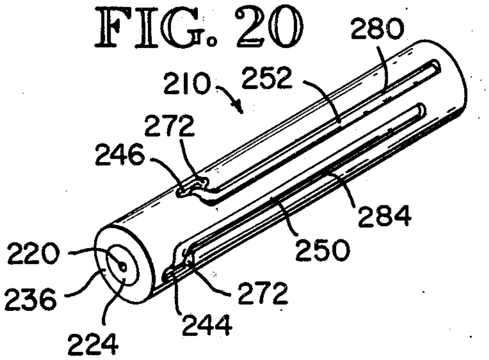
FIG. 19
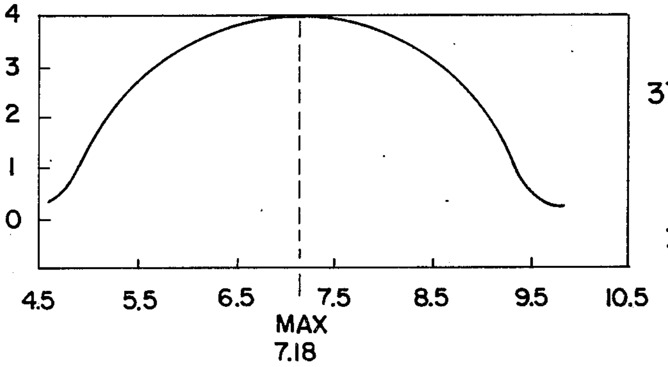
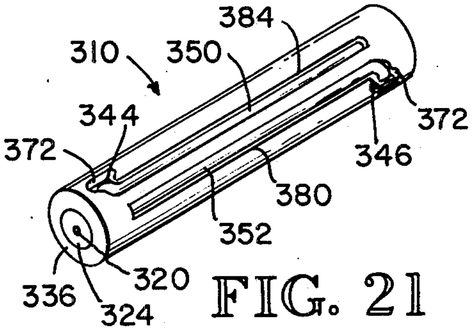
FIG. 21

MICROWAVE EQUALIZER WITH COAXIAL CABLE RESONANT STUBS

BACKGROUND OF THE INVENTION

1. Field of the Invention

The microwave equalizer of the present invention relates in general to the field of microwave equalizers characterized by having a predetermined frequency dependent attenuation characteristic over a given band of operating frequencies. More particularly, the present invention relates to the art of providing such an equalizer through the use of a length of transmission line to which is coupled at least a pair of substantially identical resonant stubs and shunt impedances spaced at quarter wavelength intervals.

2. Description of the Prior Art

It is well known that most microwave devices or networks which generate, amplify or transmit electromagnetic energy in the microwave region exhibit an output whose relative amplitude or gain is frequency dependent. Thus, over a given frequency band of operation, or so-called operating band it is seen that the output is relatively greater for some frequencies than for others.

A good example of such behavior is the traveling wave tube whose somewhat peaked gain (at band midpoint) versus frequency characteristic is well known. However, the requirements of users of such devices have become quite exacting as to what constitutes acceptable operating characteristics or parameters when such devices are utilized in apparatus having increasingly stringent and involved design criteria. Consequently, one user may require the traveling wave tube to produce a flat gain versus frequency characteristic, while another may require a tapered characteristic, and another may require a certain variable characteristic. It is apparent that the difficulty and expense of redesigning the active device, here the traveling wave tube, to produce the required output characteristic effectively precludes such an option.

Hence, passive attenuation devices or networks called "equalizers" have been developed which when coupled to the output of the active microwave device, such as a traveling wave tube, can modify the output thereof over a given operating frequency band so as to produce the required gain versus frequency characteristic. Many different forms of equalizing devices are known, but all share the common feature of exhibiting an attenuation curve which, over the operating frequency band, mirrors somewhat the normal frequency versus gain characteristic of the active device in such a way that the desired frequency versus gain characteristic is obtained.

In general it is known, or can be easily derived from text book knowledge, that it is possible to fabricate a microwave equalizer utilizing the basic principle of coupling two resonant stub transmission line segments to a third transmission line through absorptive loss elements at a spacing of approximately one-quarter wavelength of the frequency within the operating frequency band at which maximum attenuation occurs. Such devices are shown in U.S. Pat. No. 3,548,344 issued Dec. 15, 1970 to Putz and U.S. Pat. No. 3,648,200, issued March 7, 1972 to Harrison et al, for example. However, the equalizers disclosed in these patents are physically large and relatively bulky, and quite likely, correspondingly relatively heavy. Further, these patents do not disclose any means by which to compensate for so-called standing waves, commonly considered in terms of the devices' voltage standing wave ratio (VSWR), which are inevitably introduced into this type of microwave equalizer through the use of the aforesaid resonant stubs.

In many applications for such microwave equalizers, as in the aerospace industry, it is readily appreciated that where weight and space are at a premium, microwave equalizers exhibiting small size and a correspondingly low weight are exceptionally valuable. Yet, to be economic, such an equalizer should not exhibit the usual hefty cost increases usually associated with the miniaturization of devices. Naturally, if a small, lightweight, low cost microwave equalizer was available with a desirable, lower voltage standing wave ratio than is normally encountered in the aforesaid class of microwave equalizers which utilize quarter wavelength spaced resonant stubs, its contribution to the art would be self-evident. Such a device is provided by the microwave equalizer of the present invention.

SUMMARY OF THE INVENTION

In basic form, microwave equalizers of the present invention comprise a length of coaxial transmission line having one or more relatively flexible, coaxial resonant stubs coupled thereto through corresponding absorptive loss elements. By specifying each resonant coaxial stub to be flexible and of a relatively small diameter, compactness of the microwave equalizer is achieved by bending each stub to dispose it closely adjacent the outer surface of the coaxial transmission line.

Further aspects of the present invention improves the voltage standing wave ratio inherently introduced into a microwave equalizer which utilizes quarter wavelength spaced resonant stubs, by providing for at least a portion of the transmission line located generally between the coupling points for at least two stubs' film resistors to comprise material(s) having an effective dielectric constant lower than that of the adjacent dielectric material in the transmission line.

Other aspects of the present invention require that the absorptive loss elements be film resistors, and that both the film resistor retaining means and the quarter wavelength spaced resonant stubs be received in recesses defined in the relatively thick outer conductor of the transmission line.

Further aspects of the present invention optimize the compactness thereof for both relatively high and relatively low frequency applications by specifying particularly advantageous locations for both the coupling points for the quarter wavelength spaced resonant stubs and for the recesses which receive them.

Other aspects of the present invention require shunting a capacitor across each resonant coaxial stub while reducing their length to spread the minimums of the equalizer's attenuation curve while producing the desired operating frequency band.

A further aspect of the present invention specifies that when an annular recess in the outer conductor of the transmission line is utilized, about which the flexible resonant coaxial stubs may be wrapped, both the internal and external diameters of said outer conductor are lessened in this region to thereby provide a more compact microwave equalizer. However, in such event it is also necessary to utilize in this region a lower dielectric constant material as compared to that utilized in the nonrestricted portions of the transmission line.

It is a primary object of the present invention to provide a low cost, easily reproducible microwave equalizer.

Another object of the present invention is to provide a microwave equalizer that is so compact that its diameter is substantially equal to the diameter of the coaxial transmission line to which it is to be coupled.

A further object of the present invention is to provide a convenient, ready to use microwave equalizer having a generally cylindrical, capsule like, conformation and being adapted to be inserted into a housing having a coaxial connector at each end.

It is a further object of the present invention to provide a microwave equalizer in the form of a cylindrical unit with end terminals which may be readily attached to standard coaxial connectors.

A further object of the present invention is to provide a microwave equalizer whose attenuation characteristic may be altered by shunting a capacitor across each resonant stub, changing the length of each resonant stub, changing the characteristic impedance of each resonant stub and/or changing the resistance of the absorptive loss elements.

Another object of the present invention is to provide a microwave equalizer which is rugged, mechanically simple, highly reliable, thermally stable and susceptible to easy replication on a mass production basis.

A further object of the present invention is to provide a microwave equalizer in which the lowest higher order mode occurs at a relatively high frequency by means of the small size of the coupling/decoupling cavity encountered in the microwave equalizer.

Another object of the present invention is to provide a microwave equalizer having an improved voltage standing wave ratio as compared to other microwave equalizers utilizing quarter wavelength spaced resonant stubs.

Another object of the present invention is to provide a microwave equalizer which, although not of uniform cross section, provides a substantially constant characteristic impedance throughout the length thereof.

A further object of the present invention is to produce a microwave equalizer which can be easily adapted to produce a desired, predetermined attenuation characteristic over a given frequency band of operation.

These and further objects, features, advantages and characteristics of the coaxial microwave equalizer of the present invention will be apparent from the following more detailed description of the preferred embodiment.

BRIEF DESCRIPTION OF THE DRAWINGS

FIG. 1 is an exploded isometric view from an upper aspect of the microwave equalizer of the present invention along with its associated housing for connection to standard coaxial connectors;

FIG. 2 is a longitudinal cross section of the microwave equalizer shown in FIG. 1, taken substantially along line 2—2 thereof;

FIG. 3 is a cross-sectional view of the microwave equalizer of FIG. 2 taken substantially along line 3—3 thereof;

FIG. 4 is an isometric view from an upper aspect of the other side of the relatively high frequency embodiment of the present invention shown in FIG. 1;

FIG. 5 is an isometric view from an upper aspect of a relatively low frequency embodiment of the microwave equalizer of the present invention;

FIG. 6 is a transverse cross-section of the microwave equalizer illustrated in FIG. 5, taken substantially along line 6—6 thereof;

FIGS. 7–9 illustrate alternative methods of terminating each resonant coaxial stub utilized in the microwave equalizer of the present invention;

FIG. 10 is an isometric view from an upper aspect of one of the film resistors utilized in the present invention;

FIGS. 14–18 are graphic illustrations of the effects of altering various parameters on the attenuation characteristic of the microwave equalizer of the present invention;

FIG. 19 is a graphic illustration of the attenuation characteristic exhibited by the microwave equalizer of FIGS. 1–4; and FIGS. 20 and 21 are isometric views from a lower aspect of alternative embodiments of the present invention shown in FIGS. 4 and 5 respectively.

DESCRIPTION OF THE PREFERRED EMBODIMENTS

Figure 11:
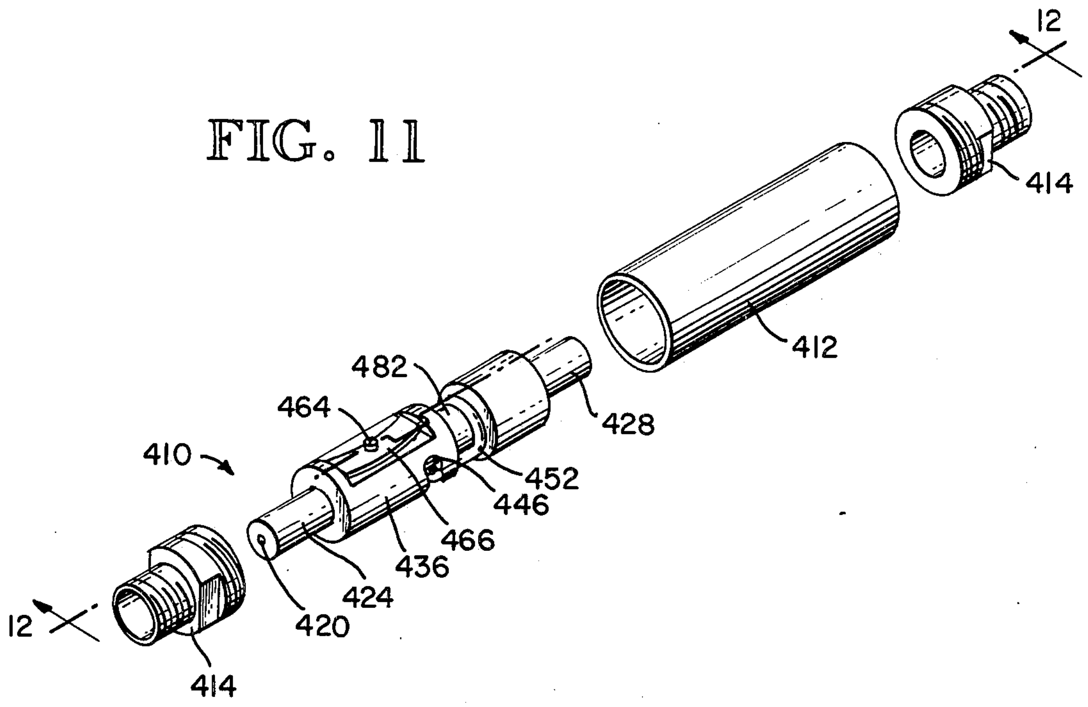
FIG. 11 is an exploded isometric view from an upper aspect of another embodiment of the microwave equalizer of the present invention.

As has been described, in the aforesaid type of microwave equalizer which utilizes quarter wave length spaced resonant stubs, each resonant stub is coupled to its respective absorptive loss element which is, in turn, shunted to a segment of transmission line. In operation, as is generally known, each resonant stub couples its respective absorptive loss element, usually a resistor, to the transmission line in an amount which is dependent upon the resonant stub's reactance which is, of course, a function of frequency. The amount of coupling of each absorptive loss element to the transmission line is also dependent upon the ratio of the characteristic impedance of the transmission line to that of each absorptive loss element.

In determining whether the absorptive loss elements are effectively coupled or uncoupled to the transmission line, the effective electrical length of each resonant stub becomes important. When a stub is open circuited, and if its effective electrical length is an odd number of quarter wavelengths, then maximum attenuation is achieved; while if its effective electrical length is an even number of quarter wavelengths, minimun attenuation is achieved. Just the reverse situation occurs when a stub is short circuited, i.e. maximum attenuation is obtained when its effective electrical length is an even number of quarter wavelengths; while an effective electrical length of an odd number of quarter wavelengths produces minimum attenuation. Naturally, the effective electrical length of each stub depends not only on its actual physical length, but also upon whatever concentrated elements (lumped reactances) there may be coupled thereto. Thus, we see that the effective electrical lengths of the stubs determines the operating frequency band of the microwave equalizer, and consequently also influences somewhat the profile of the attenuation curve thereof.

The profile of the attenuation curve is also influenced by other factors which will be discussed in greater detail subsequently. Among these factors are the characteristic impedance of the stubs, the impedance of the segment of transmission line located between the coupling points of the stubs, and the resistance of the absorptive loss elements. The size and location of any concentrated elements which are coupled to the resonant stubs will also affect the profile of the attenuation curve. By proper choice of these various parameters, a microwave equalizer may be configured that will achieve a particular desired attenuation characteristic, subject, of course, to the inherent limitations of the apparatus.

Turning now to the drawings, and in particular to FIG. 1, we see a capsule-like embodiment of the microwave equalizer 10 of the present invention which is designed for a relatively high frequency band of operation. In use, the capsule-like equalizer is inserted into the housing 12, and then the coaxial adapters 14 are threadedly connected to the ends of the housing by means of threads 16 located on one end of each coaxial adapter and by means of co-responding threads 18 located at each end of the housing. The housing is sized to receive the equalizer with a relatively snug fit and is relatively thin-walled so as to maintain the overall diameter of the equalizer plus housing to a minimum. The housing may be constructed of electrically nonconductive materials, but metallic materials are preferred for their greater strength which enable the housing to better perform the function of protecting the equalizer. In addition a metallic, good conducting housing serves as a shield to prevent the equalizer from radiating the microwaves it conveys and to prevent outside electromagnetic waves from being introduced into the circuit of which the microwave equalizer is a part.

The coaxial adapters 14 are of conventional construction and serve merely as a means whereby any microwave circuit terminating in a standard coaxial connector may be connected to the capsule-like microwave equalizer 10 shown in FIG. 1. Of course, although the coaxial adapters 14 are shown as being of "female" construction, coaxial adapters of "male" or "sexless" construction could also be utilized, depending on the needs of the user.

It is to be understood that the form of the coaxial adapters 14 illustrated in FIG. 1 is by way of illustration only, and that the microwave equalizer may be used with any other form of adapters whether it be coaxial or not. In fact, many forms of non-coaxial adapter means are frequently encountered where microwave equalizer are utilized, as in microwave integrated circuits. Similarly, any other form of housing could be used with the equalizer 10 and, in certain applications, the housing 12 may be eliminated as being unnecessary. But whatever form of housing 12 and adapters 14 are used, it is to be understood that one aspect of the present invention is to provide a capsule-like microwave equalizer which may be conveniently utilized in combination therewith.

By way of nonlimiting example, applicant will now give a quite detailed description of the embodiment of the present invention shown in FIGS. 1-4. Of course, as will be explained more fully subsequently, the dimensions, composition and electrical characteristics of the various elements comprising the present invention significantly affect its operating parameters, and in particular the profile and operating frequency band of its attenuation curve. Therefore, the detailed example which will now be set forth should not be considered as restrictive upon the scope of the present invention since the details of construction of any particular microwave equalizer will vary according to the needs of the user. Thus, the scope of the present invention should be determined only by the appended claims.

The microwave equalizer of FIGS. 1-4 is designed for the relatively high frequency band of operation of from 4.75 to 9.6 gigahertz and exhibits the attenuation characteristic shown in FIG. 19 when the end of each stub 50, 52 is terminated with a 0.35 picofarad capacitor as shown in FIG. 9. In this figure, the loss in decibels of the microwave equalizer is measured on the ordinate, while the frequency in gigahertz is measured on the abscissa.

Referring now to FIG. 2, it is seen that the central, series conductor 20 comprises a generally cylindrical, elongated brass element having a length of 1.030 inches and a diameter of 0.047 inches. The conductor 20 has an undercut portion 22 with a slightly lesser diameter of 0.044 inches.

A generally cylindrical support 24 surrounds a portion of one end of the conductor 20 and is formed from Teflon or other suitable dielectric material. The support 24 has an overall length of 0.495 inches, an external diameter of 0.151 inches and an internal bore 25 with a diameter of 0.047 inches which receives the conductor 20. One end of the support 24 further includes an annular recess 26 having a depth of 0.015 inches and a diameter of 0.108 inches.

The other end of the conductor 20 is carried by a second support 28 having an outer diameter of 0.151 inches, an internal bore 30 0.048 inches in diameter, and an annular recess 32 at one end having a depth of 0.015 inches and a diameter of 0.108 inches. The second support 28 is also composed of Teflon or other suitable dielectric material. Between the supports 24, 28 is a generally cylindrical air filled chamber 34 having an external diameter of 0.108 inches and a length of 0.360 inches.

Surrounding the center conductor 20, the supports 24, 28 and the chamber 34 is a concentric thickened outer brass conductor 36 having a length of 1.03 inches. One end portion 86 of the outer conductor has a length of 0.235 inches, a maximum diameter of 0.288 inches and defines a cylindrical cavity 40 having a length of 0.200 inches and a diameter of 0.151 inches which receives the support 28. Functionally, since the major purposes of the end portion 86 are to provide an end wall for the annular recess 82 and to provide a cavity 40 for support 28 which carries that end of the center conductor 20, a somewhat shorter end portion 86 could be provided than that illustrated in FIGS. 2 and 4. The other end portion 41 of the outer conductor has a length of 0.535 inches, a maximum diameter of 0.288 inches and defines a generally cylindrical cavity 38 having a length of 0.500 inches and a diameter of approximately 0.151 inches which receives support 24. As can be appreciated, outer conductor 36 is machined from a cylindrical piece of brass, copper or other electrically conductive material having a diameter of at least 0.288 inches and a length of at least 1.030 inches.

Into each end of the outer conductor 36 are cut centering steps 42 which reduce the diameter of the end portions 41, 86 of the outer conductor to 0.268 inches for a distance of 0.030 inches from the ends thereof.

These centering steps serve as positive guide means by which the corresponding electrical elements in the microwave equalizer and the coaxial adapters 14 are axially aligned to ensure proper contact therebetween. Of course, centering steps 42 would not be necessary if the overall external diameter of the microwave equalizer were reduced 0.268 inches.

Between the end portions 41, 86 of the outer conductor is an annular storage recess 82 having a length of 0.265 inches and a minimum diameter of 0.168 inches, about which the free end portion of resonant stub 52 is wrapped, and into which the free end portion of resonant stub 50 extends, as seen in FIG. 4. Of course, in some configurations, the free end portions of both resonant stubs 50, 52 may be wrapped about recess 82. As is seen in FIG. 2, the radial thickness of the outer conductor is reduced to 0.060 inches for the length of the annular recess. The annular recess 82, by supplying a storage area for the free end portions of the resonant stubs 50, 52 permits the overall length of the equalizer to be reduced over that which would be required if the free end portions were stored in generally longitudinal slots in the outer conductor 36.

Within end portion 41 of the microwave equalizer of the present invention are found a pair of film resistors 44, 46 along with their respective retaining pins 48. As seen in FIG. 10, each film resistor is of conventional construction and comprises an alumina substrate 54 upon which have been deposited a conductive contact 56 for the center conductor 20 and a contact 58 for its respective resonant stub 50 or 52. Between the contacts 56, 58 is located a stratum or film of electrically resistive material, such as carbon or a thick film paste, which may be applied by conventional methods such as by a standard thick film silk screening process, which offers considerable manufacturing and cost benefits. In the present example, the alumina substrate is 0.015 inches thick and has the dimensions of 0.070 inches by 0.120 inches. The stratum of resistive material comprises a strip 0.010 inches wide and 0.040 inches long. Both contacts 56, 58 comprises a gold film and have the dimensions 0.030 inches by 0.050 inches, and 0.030 inches by 0.070 inches, respectively. Naturally, the exact dimensions of the contacts 56, 58 and the resistance material 60 can be varied according to the needs of the user. In the present example, the resistance of each film resistor was 120 ohms. Film resistors are preferred in the present invention for their small size, accuracy of value and low unwanted intrinsic capacitive and inductive reactances. However, other form of resistors not having all of these properties could be utilized in the present invention if the user is aware of their limitations. If it is desired that the film resistor have a higher heat dissipation capacity, the substrate 54 can be composed of beryllium oxide.

As seen in FIG. 3, film resistor 46 straddles the center conductor 20 and the center conductor 62 of its respective resonant stub 52. Referring to FIG. 2, retaining screw 64 secures to the outer conductor 36 the retaining spring 66 which straddles pins 48. The retaining spring urges the retaining pins 48 into contact with their respective film resistors, thereby holding each film resistor in conductive electrical contact across center conductor 20 and the center conductor 62 of its respective stub. It is seen that the retaining screw 64 projects for a short distance into the support 24. This is to secure the support 24 against relative movement with respect to the outer conductor 36 during the boring of film resistor cavities 72 to ensure that the portions of the cavities 72 in the support 24 are aligned with those portions of the cavities 72 in the outer conductor 36.

Each retaining pin is formed from a durable, nonconductive, nondeformable, high temperature resistant material such as polypropylene oxide (PPO) manufactured by General Electric, and travels in its respective bore 70. A retaining spring recess 68 is provided in the outer conductor 36 and is sized so that no portion of the retaining spring or its retaining screw projects outwardly of the outer conductor, for more compact storage. As is seen, the thickened outer conductor 36 is necessary in order to provide a suitable recess 68 as well as to provide a secure mount for retaining screw 64.

In FIG. 3, it is possible to conductively connect the outer end 47 of the film resistor directly to the outer conductor 36 by substituting a highly conductive member such as brass, for the short leg 74 of the stub 52. Such a construction would provide, if used alone, a relatively flat attenuation curve over an operating frequency band.

As seen in FIG. 3, the film resistor 46 is received in a film resistor cavity 72 that is 0.062 inches high by approximately 0.075 inches wide, and which extends generally transversely into the equalizer a depth of 0.168 inches. It is noted that the positioning of the retaining pin 48 is such that it presses against the film resistor 46 at some point between the film resistor's points of contact with the center conductor 20 and the center conductor 62 of stub 52 to thereby ensure good electrical contact between these elements. A transverse cross section taken across the microwave equalizer shown in FIG. 2 at film resistor 44 would reveal structural details analogous to those illustrated in FIG. 3, and hence such details will not be explained further.

Referring now to FIGS. 1 and 3, it is seen that coaxial stub 52 comprises a relatively L-shaped member having a shorter leg 74, about 0.125 inches in length from which the center conductor 62 extends 0.025 inches to contact film resistor 46, and a longer leg 76, about 0.645 inches in length, the end portion of which is wrapped about annular recess 82. The overall length of stub 52 is 0.633 inches. The center conductor 62 extends from the end of the stub 52 a distance of 0.025 inches $\pm 0.005$ inches. Its amount of extension is important so that the quantum of parasitic inductance it introduces may be taken into consideration. In addition, the center conductor 62 must extend a distance sufficient to prevent the film resistor from shorting against adajcent portions of the outer conductor 36 of the equalizer and any elements grounded thereto. The portion of the outer conductor 78 of stub 52 which is adjacent the film resistor cavity 72 is grounded to the outer conductor 36 of the equalizer, as by soldering. A resonant stub recess 80 is provided for resonant stub 52 which communicates from film resistor cavity 72 to the annular recess 82.

As seen in FIG. 4, resonant stub 50 is substantially identical to resonant stub 52 in mounting and construction except that, since its length would not extend past the end of the microwave equalizer, it is not coiled about annular recess 82. The portion of stub 50 located between the film resistor cavity 72 and annular recess 82 is seen to be carried by a longitudinal slot 84. Resonant stubs 50, 52 are of substantially equal length and each have their center conductors 62 conductively connected to the center conductor 20 of the microwave equalizer through their respective film resistors 44, 46 at locations spaced substantially a quarter wavelength apart at a frequency within the operating frequency band. Typically, this frequency is the frequency is the frequency at which the equalizer exhibits maximum attenuation.

Referring now to FIG. 7, it is seen that resonant stub 52 comprises a length of 50 ohm microcoaxial cable number UT-47 manufactured by Uniform Tubes, Inc. of Collegeville, Pa, whose outer conductor 78 has a diameter of 0.047 inches and whose center conductor 62 has a diameter of 0.011 inches. Solid dielectric material 63 fills the region between center conductor 62 and outer conductor 78. Resonant stub 50 is of identical construction, and the very end of the film resistor end of the outer conductor 78 of each is grounded to the outer conductor 36 as by soldering. Both stubs are of substantially the same length.

As seen in FIGS. 1–4 and 7, both resonant stubs 50, 52 are terminated in an open circuit. However, in some applications, both stubs may be terminated in a short circuit, as seen in FIG. 8, by soldering the end of center conductor 62 to the outer conductor 78. The effects of open and short circuiting the stubs has been previously described. In other applications, each stub may be shunted by a capacitor 79 comprising a thin disc of dielectric material 81 having a coating of conductive material 83 on facing sides thereof, as shown in FIG. 9. The dielectric material 81 may be ceramic alumina and the conductive material 83 may be silver. Typically, the capacitor may be 0.009 inches in thickness, have a diameter of 0.050 inches and have a capacitance of 0.35 picofarads.

Since it is a primary purpose of the present invention to provide a microwave equalizer of extremely compact size, naturally each resonant stub 50, 52 is chosen to have as small an external diameter as is practicable. One constraint on the lower limit of the diameter of each stub is that the center conductor 62 must have a diameter sufficient so that it will not bend over under the pressure of its respective spring-loaded film resistor 44, 46 in order to prevent short circuiting, as has been described. Another limit on the minimum diameter of each stub is that as the diameter decreases, the losses experienced in each stub increase correspondingly, until a point is reached that further decreases in size cause unacceptable losses in each stub.

The designed diameter of the microwave equalizer, which is generally inversely related to the frequencies of its operating frequency band, will naturally influence the maximum diameter of the stubs which can be permitted. However, the maximum diameter of the stubs will also be governed by how small a bending radius they can achieve without experiencing cracking of their outer conductors. In each L-shaped stub previously described, an inside bending radius of one-sixteenth of an inch is required between legs 74 and 76. However, the smallest bending radius required will, of course, depend upon the particular design and the overall size of the microwave equalizer. In some cases, it may be that the minimum bending radius is governed by the smallest diameter of the annular recess 82 about which the stub(s) are wrapped.

It is seen that together, the center conductor 20, the supports 24, 28, and the outer conductor 36 form a length of coaxial transmission line which has, in the instant case, a characteristic impedance of 50 ohms, and which has a mid-segment located between the quarter wavelength spaced contact points for the film resistors 44, 46 with the center conductor 20. The thickness of the other conductor 36 is governed primarily by the diameter of the stubs 50, 52, with physical sturdiness also being considered. Having a characteristic impedance of 50 ohms, it is seen that it is adapted to be connected to a 50-ohm system.

Now that a detailed description of the embodiment of the present invention shown in FIGS. 1–4 has been given, some of the considerations which effect the choice of size of components thereof, besides the stubs just discussed, will now be addressed.

First, the radial thickness of the outer conductor 36 of the microwave equalizer is preferably chosen such that it is slightly thicker than the diameter of the stubs 50, 52. This permits the resonant stub recesses 80, 84 and the annular storage recess 82 to be cut into the outer conductor 36 to a depth such that no portion of the stubs extends outwardly therefrom. Of course, if such degree of protection were not needed, the radial thickness of the outer conductor 36 could be chosen to be smaller than the diameter of the stubs, as long as the outer conductor is of sufficient thickness to support the retaining spring 66 and retaining screw 64. In such case, it is possible that the recesses 68, 80, 84 and/or 82 be eliminated entirely and the stubs be merely disposed closely adjacent the outer conductor 36.

Second, as has been previously mentioned, the only critical longitudinal spacing within the microwave equalizer is the center-to-center spacing of the contact points of the film resistors 44, 46 with the center conductor 22. This spacing should be approximately one quarter of the wavelength of one of the frequencies of the operating frequency band, typically the frequency at which maximum attenuation occurs in the microwave equalizer.

The longitudinal length of the annular storage recess 82 is governed primarily by consideration of what portion of the lengths of the stubs 50, 52 must be stored therein. In fact, as will be discussed subsequently, in some embodiments the annular recess 82 is eliminated. The longitudinal length of the end portion 86 of the microwave equalizer may be relatively short since its primary functions are to provide an end wall 88 for the annular storage recess 82 and to provide a rugged connection point for the coaxial connector it is adapted to receive.

As seen in FIGS. 20, 21, the annular storage recess 82 has been eliminated. In these figures, elements corresponding to the elements shown in the embodiment of the present invention shown in FIGS. 1–4 are numbered in the 200 and 300 series, respectively.

The microwave equalizer shown in FIG. 20 is designed for a relatively high frequency since the quarter wavelength spacing of the contact points of each stub's film resistor with the central conductor 220, and the corresponding length of each stub is relatively short. It is seen that for this relatively high frequency embodiment of the present invention, both contact points are located adjacent one end of the equalizer and the storage recesses 280 and 284 for the stubs 252, 250 comprise elongated slots extending towards the other end of the microwave equalizer.

Referring now to FIG. 21 it is seen that, for relatively lower frequencies, the quarter wavelength spacing of the contact points of the film resistors with the center conductor 320 becomes such that storage recesses 380, 384 for the stubs 352, 350 may be provided therebetween.

The embodiments of the present invention shown in FIGS. 20, 21 are, except for the change in the provision of storage means for the resonant stubs, substantially identical to the construction of the embodiments of the present invention shown in FIGS. 1–4 and 5 respectively and hence will not be discussed in detail. Naturally, the overall length of the forms of equalizer shown in FIGS. 20, 21 may be somewhat longer than that shown in FIGS. 1–6 since no annular storage recess 82 is provided about which the ends of the stubs may be wrapped. In addition, it will be appreciated that although the storage recesses 280, 284, 380, 384 are generally longitudinal, they could be curved, helical, etc. The straight recesses 280, 284, 380, 384 are preferred because of the ease of machining, but the curved forms would provide a somewhat more compact equalizer.

The embodiment of the present invention shown in FIGS. 1–4 is designed for a relatively high frequency, since the quarter wavelength spacing of the stubs along the center conductor 20 effectively precludes locating storage areas for the stubs therebetween. Thus the film resistors 44, 46 are located adjacent the end of the equalizer while the storage recess 82 is located adjacent the other end thereof.

However, for relatively lower frequencies, the longer quarter wavelength spacing of the stubs along the center conductor 620 permits the annular storage recess 682 to be located therebetween. Since the length of each stub 650, 652 generally increases as the frequency of the operating frequency band decreases, it becomes apparent that storage recess 682 will have a longitudinal length that will be correspondingly greater than the longitudinal length of the storage recess 82 which was necessary for the relatively higher frequency embodiment shown in FIGS. 1–4.

Turning now to the embodiment of the present invention shown in FIGS. 5 and 6, elements therein corresponding to those of the embodiment shown in FIGS. 1–4 are given similar numbers but in the 600 series, e.g. center conductors 620 corresponds to center conductor 20. The construction of the embodiment shown in FIGS. 5 and 6 is substantially identical to the construction of the embodiment shown in FIGS. 1–4 except that, of course, the storage recess 682 has been moved between the contact points for the film resistors with the center conductor 620 and will not be discussed further. Because of the relocation of the storage recess 682, it is necessary to provide a separate retaining screw 664, retaining spring 666 and retaining spring recess 668 for each retaining pin 648, as shown.

In addition, it is noted that the construction and arrangement of the various elements at each end of the microwave equalizer shown in FIG. 5 are identical. Thus, the cross section of the left end of the microwave equalizer of FIG. 5, which is shown in FIG. 6, would be substantially identical to a similar cross section taken of the right end thereof.

Turning now to other matters, applicant has discovered, while fabricating the capsule like form of his present invention illustrated in FIGS. 1–5, that each coaxial adapter 14 was relatively expensive inasmuch as each contains a spring loaded contact piece, not illustrated, adapted to make positive electrical contact with the center conductor 20. In order to eliminate the need for utilization of the fairly costly coaxial adapters 14, applicant devised the alternative embodiment of his present invention illustrated in FIGS. 11–13 in which features corresponding to those of the embodiment shown in FIGS. 1–3 are numbered in a 400 series, e.g. center conductor 420 corresponds to center conductor 20.

Figure 12:
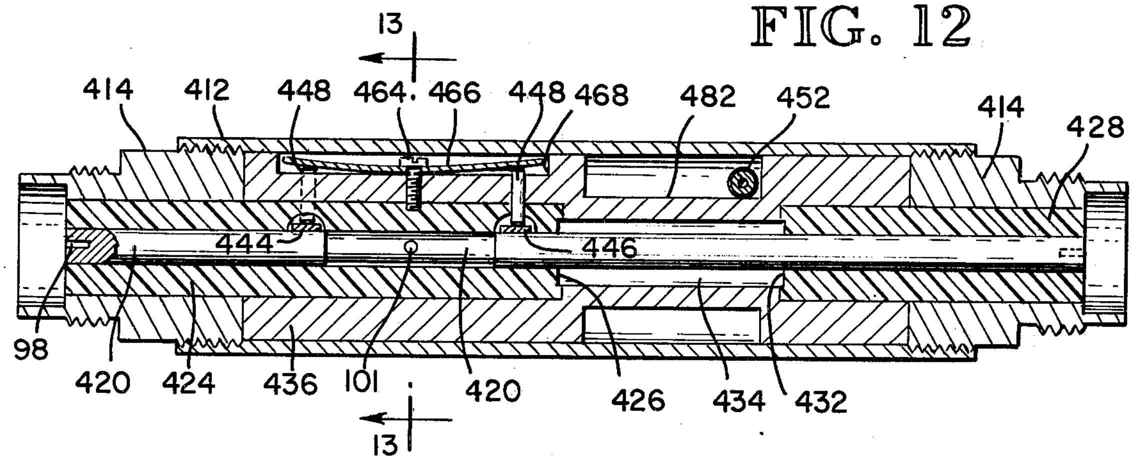
FIG. 12 is a longitudinal cross-section of the microwave equalizer of FIG. 11, taken substantially along line 12—12 thereof.
Figure 13:
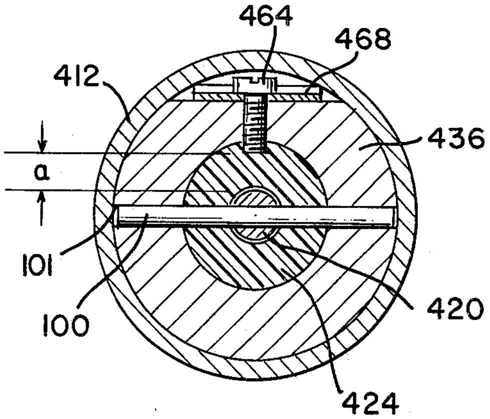
FIG. 13 is a transverse cross-section of the microwave equalizer of FIG. 12, taken substantially along line 13—13 thereof.

The microwave equalizer of the present invention shown in FIGS. 11–13 is almost identical to that illustrated in FIGS. 1–3 except that it lacks a centering step 42 at each end, and its center conductor 420 and its supports 424 and 428 protrude longitudinally for a moderate distance past the outer conductor 436. As seen in FIG. 11, this embodiment of the present invention is adapted to be connected to standard coaxial connectors, not shown, by being first inserted into housing 412, after which a coaxial adapter 414 is screwed onto each end thereof. Together, the coaxial adapters 414, the protruding ends of the center conductor 420, and the protruding ends of the supports 424, 428 form a standard coaxial connector, as shown, for both ends of the equalizer. Thus, when so assembled, a standard coaxial connector of conventional design may be then threadedly connected to each coaxial adapter 414 in the usual fashion.

We turn now to FIG. 12, in which the housing 412 and coaxial adapters 414 are shown in an assembled relation with the microwave equalizer 10 in order to show the proper relationship among the various components. Each coaxial adapter 414 together with its associated end portion of the center conductor 420 and support 424 or 428 forms a standard female connector. However, it is within the scope of the present invention that the parts could be so arranged to form a standard male type coaxial connector.

It is seen that retaining screw 464 not only secures the retaining spring 466 but also helps to secure the support 424 against longitudinal movement, as when a standard coaxial connector is screwed to the end of coaxial adapter 414. However, the problem still remains of how to anchor the center conductor 420 against longitudinal movement in such a situation. As seen in FIG. 13, applicant's answer has been to insert a nonconductive retaining pin 100 through a transverse bore 101 which pierces both the center conductor 420 and the support 424. For simplicity of construction and to ensure proper electronic operation of the microwave equalizer, as will be apparent, it is important that the bore 101, the retaining pin 100, and retaining screw 464 lie substantially in the same transverse plane.

The bore 101 introduces a series inductance into the microwave equalizer which has to be compensated for. This may be done in two ways, the first being to introduce a parallel capacitance which lies in the same transverse plane as the bore 101. The desired capacitance can be introduced and adjusted by the simple expedient of using the retaining screw 464 as the source of the desired capacitance. The amount of capacitance provided by screw 464 is proportional to the distance "a" shown in FIG. 13, and may be regulated by adjusting the distance "a". Alternatively, the series inductance introduced by the bore 101 is compensated for by choosing the retaining pin 100 to have a dielectric constant which is greater than that of the dielectric material composing the support 24.

It is apparent that the form of connector construction utilized in the present invention shown in FIGS. 11–13 is also suitable for the other embodiments shown in FIGS. 1–6, 20 and 21. Similarly, the form of connector shown in FIGS. 11–13 is only by way of example, with any other form of coaxial connector being within the scope of the present invention. Applicant would like to make clear that the general form of the connector shown in FIGS. 11-13 is not novel, but that it is his new way of producing it, in the manner described, which he considers new.

At this point, it will be appreciated that all of the embodiments of the present invention heretofore described are capable of producing an extremely compact microwave equalizer whose diameter can be as small as that of the coaxial cables to which it is adapted to be connected. It is also apparent that they also provide an equalizer whose length is very short, primarily due to the provision of annular storage recess 82, 482 and 682. Even when said annular storage recesses are not utilized, the overall length of the equalizers are still quite short as compared to conventional equalizers.

Turning now to other matters, it is well known that the discontinuity introduced into a microwave equalizer by a first resonant stub is substantially cancelled by the reflection of a like discontinuity by a second resonant stub spaced a quarter wavelength away. However, the utilization of such a pair of resonant stubs also introduces a voltage standing wave ratio into a microwave equalizer.

The microwave equalizer illustrated in FIGS. 1-4 normally has a maximum voltage standing wave ratio of approximately 1.30. Applicant has discovered that the undercut portion 22 partially compensates for this voltage standing wave ratio and improves it by lowering it to approximately 1.20. Preferably, approximately the full quarter wavelength portion of the center conductor between the central portion of the contacts of the film resistors 44, 46 with the central conductor 20 should be undercut. However, to ensure that the film resistor contacts are physically stable in their cavities, only a portion of this distance, as shown, has been undercut so that the undercut portion 22 has a diameter of 0.044 inches as compared to the adjacent portions of the center conductor 20 which have a diameter of 0.047 inches.

Applicant theorizes that small increases in the characteristic impedance of that portion of the microwave equalizer located within the aforesaid quarter wavelength distance between the film resistors, as compared to the normal 50-ohm characteristic impedance of the adjacent portions of the microwave equalizer, results in a reduction in the voltage standing wave ratio of the microwave equalizer as a whole. It is known that the impedance of any coaxial transmission line is given by the equation:

$$Z=(60/\epsilon r)\ln(d_1/d_2)$$

wherein $\epsilon r$ is the relative dielectric constant of the dielectric material in the transmission line, $d_1$ is the internal diameter of the outer conductor, and $d_2$ is the external diameter of the inner conductor.

Thus it becomes apparent that in order to obtain the desired increase in the characteristic impedance for those portions of the microwave equalizer located generally between the film resistors 44, 46, it is necessary to decrease the effective dielectric constant of the dielectric material surrounding the center conductor in this area as compared to the dielectric constant of the material in adjacent portions of the microwave equalizer. Additionally, the ratio of $d_1$ to $d_2$ may be increased. Both these manipulations may be done a number of ways, but applicant prefers, for simplicity of construction, to merely undercut a portion of the central conductor as has been heretofore described. It is apparent that for those undercut portions of the center conductor, there will be two concentric layers of dielectric material: a layer of air having a radial thickness of 0.0015 inches and a layer of Teflon having a radial thickness of 0.052 inches. The actual depth and length of the undercut, because of the intricate effects of small changes in the size of components within microwave devices, is best determined by making a series of progressively deeper and/or longer cuts, each time measuring the voltage standing wave ratio of the microwave equalizer.

It is apparent that there are other ways of achieving the basic concept of improving the voltage standing wave ratio of the microwave equalizer, in the manner specified, besides that of reducing the diameter of a portion of the center conductor and using a layer of air dielectric. For example, a more expensive and cumbersome alternative would be to provide in the region located generally between the film resistors, sleeve(s) of dielectric material having a dielectric constant which is lower than that of the dielectric material located adjacent thereto.

In addition the voltage standing wave ratio can be improved by increasing the internal diameter of the outer conductor 36 for those portions of the outer conductor 36 located generally between the quarter wavelength spaced resonant stubs.

Naturally, the VSWR of any of the embodiments of the present invention can be improved in the manner heretofore specified.

Turning now to other matters, and referring now to FIG. 2, we see that the internal diameter of that portion of the outer conductor 36 in the vicinity of the annular storage recess 82 is less than that of the adjacent portions of the outer conductor. It is seen that this reduced internal diameter of the outer conductor results in an annular shoulder 102 being formed at either end thereof. The annular shoulders 102 serve the important function of serving as stops against which the supports 24, 28 are retained against longitudinal movement when the equalizer is assembled with its housing 12 and coaxial adapters 14.

Another important function of the reduced internal diameter of this portion of the outer conductor 36 is that a recess of adequate radial thickness can be provided in the outer conductor 36 even though the diameter of the stubs 50, 52 may approach or even exceed the actual radial thickness of the outer conductor 36. It is readily appreciated that, as the diameter of the stubs 50, 52 approaches that of the radial thickness of the outer conductor 36, machining the annular recess 82 in the outer conductor to a depth sufficient to fully contain the stubs 50, 52 while still providing adequate mechanical strength to the equalizer would not be possible. It is noted that in order to provide proper mechanical strength in this portion of the outer conductor, the planes containing shoulders 102 are offset longitudinally somewhat from their respective end walls 88, 104 of the annular recess 82. Thus we see that the unique construction of the outer conductor 36 of the microwave equalizer of the present invention in the region of the annular storage recess 82 provides three important functions. It provides restraining shoulders 102, it enables storage of resonant stubs having a thickness equal to or even exceeding the radial thickness of the outer conductor, and it performs both these functions while maintaining adequate structural strength to withstand the physical forces the microwave equalizer encounters during handling and use.

In order to obtain best performance and to avoid unwanted voltage standing wave ratios, it is necessary that the characteristic impedance of the microwave equalizer be substantially uniform along its length. However, an examination of the above equation, which relates to characteristic impedance of a transmission line to the internal dimaeter of its outer conductor, reveals that the characteristic impedance of the transmission line will decrease as the internal diameter of the outer conductor decreases. As is known, such changes in the characteristic impedance of a transmission line along its length introduces undesirable mismatches or discontinuities.

Still, an examination of the above equation also discloses that as the relative dielectric constant of the material located in chamber 34 decreases the characteristic impedance of that portion of the microwave equalizer increases. Thus, we see that by appropriate selection of the internal diameter of the outer conductor in the vicinity of chamber 34 and by suitable selection of a material with an appropriate dielectric constant, it is possible to maintain the characteristic impedance of the coaxial transmission line relatively uniform along its length despite the decrease in the internal diameter of the outer conductor in the vicinity of chamber 34. Applicant has found that by selecting air to be the dielectric in chamber 34 the desirable uniformity of impedance along the length of the microwave equalizer was achieved. Additionally, it was found that when air was used as a dielectric material in chamber 34, the dielectric constant of the materials comprising supports 24, 28 should be close to that of air. Hence, Teflon with a dielectric constant of only 2.1 was selected for supports 24, 28.

However, the discontinuity in the dielectric constants of the Teflon supports 24, 28 and the air filled chamber 34 also tends to induce undesirable standing waves in the microwave equalizer. This problem is solved, as known to those skilled in the art, by providing recesses 26, 32 in the ends of the supports 24, 28 respectively which face the chamber 34. As is known, such a construction reduces the fringing capacitances which would otherwise occur between the outer conductor in the vicinity of the air chamber 34 and the supports 24, 28.

Turning now to other matters, consideration will now be given to the effect upon the attenuation curve exhibited by the microwave equalizer of the present invention when some of the parameters of the equalizer are varied. Referring now to FIGS. 14–18, we see schematic representations of various attenuation curves plotted on a coordinate system having increasing frequency as one travels on the abscissa from left to right, and increasing loss measured in decibels as one travels vertically on the ordinate. The characteristic curves shown in FIGS. 14–18 are not for a particular microwave equalizer, but instead are intended to show in a general way the effects of altering some of the various parameters of a microwave equalizer. In FIGS. 14–18, curve 500 represents the characteristic attenuation curve of a given microwave equalizer over an operating frequency band having a lower minimum 506 and upper minimum 508.

Referring now to FIG. 14, we see the effects of varying the resistance of each film resistor, with curve 502 showing the effects of an increase in the resistance of the film resistors, and curve 504 showing the effects of a decrease in the resistance of the film resistors. As is seen, the frequency of the lower band edge and the upper band edge 506, 508 respectively, remains relatively unchanged, while the maximum amplitude of the attenuation curve increases and decreases.

FIG. 15 shows the effect of varying the characteristic impedance of the stubs with curve 510 showing the effect of decreasing the impedance thereof, while curve 512 shows the effect of increasing the impedance thereof. As is seen, the lower band edge 506, and the upper band edge 508 and the maximum amplitude of curve 500 has not been substantially affected by these changes. Instead, we see that as the impedance of each stub decreases, the profile of the attenuation curve 512 becomes narrower while, as the impedance of the stubs increases, the profile of the attenuation curve 510 becomes broader.

Turning now to FIG. 16, we see the effects of shunting a capacitor across the end of each stub. As is seen, the effect is to lower the frequencies of both the lower and upper band edges from 506 to 530 and from 508 to 532, and to simultaneously bring closer together the minimums of the operating frequency band as shown by curve 522 since distance "c" is smaller than distance "b". Again, it is noted that the maximum amplitude of the curve 500 remains substantially unchanged, but occurs at a relatively lower frequency.

In FIG. 17, curve 516 shows the effect of increasing the length of each stub while curve 518 shows the effect of shortening each stub. As is seen, the effect of lengthening or shortening each stub is to shift the whole curve to the left and right, respectively. In each case, the maximum amplitude of the curve is unchanged, but occurs at a relatively lower and a relatively higher frequency, respectively. In addition, the amount of frequency change d, e of the lower band edge, in each case is approximately one half the corresponding amount of frequency change d', e' of the upper band edge, respectively, if the operating frequency bandwidth of curve 500 is approximately one octave.

Applicant has found that in many applications, having produced a microwave equalizer exhibiting a particular attenuation curve, the user frequently requires that the minimums of its attenuating curve are spaced further apart. Applicant has discovered that if he shortens the length of said equalizer's resonant stubs and simultaneously shunts a capacitor across the ends thereof he is able to achieve this desired result. This effect is shown by curve 520 in FIG. 18. As seen, the minimums 506, 508 of curve 500 are spread apart to form curve 520 with minimums at 506 and 534. By this combination applicant has achieved with his present invention an operating frequency band having an upper band edge which is of a frequency from 2.0 to 3.0 times the frequency of the lower band edge.

Thus, from the basic disclosures contained in FIGS. 14–18, it becomes apparent that it is possible to manipulate the amplitude, upper band edge, lower band edge, and shape of the characteristic attenuation curve of a microwave equalizer.

A further advantage of the microwave equalizer of the present invention is that with its extremely compact size, certain moding problems are avoided. In fact, it will be appreciated that, because of the relatively small coupling/decoupling cavities within the microwave equalizer formed substantially by film resistor cavities 72, the lowest higher order mode occurs at a considerably higher frequency than would be the case if this coupling/decoupling cavities were relatively larger, as in prior art devices. In fact, for the example microwave equalizer of the present invention for which a detailed description has been given, applicant was unable to detect the lowest higher order mode even at a frequency of 18.5 gigahertz, which was the maximum frequency available to him through his test equipment.

Although in all the embodiments of the present invention previously discussed it is preferred that the stubs be utilized in pairs in order to minimize the discontinuity introduced by a single stub, it is within the scope of the present invention that a single stub be used alone. Similarly, it is possible that the number of stubs be two or more. However, the stubs need not occur in simple multiples of two inasmuch as it is well known that four quarter wavelength spaced resonant stubs can be replaced by a suitably selected and quarter wavelength spaced set of three resonant stubs wherein the center stub has one half the characteristic impedance of the outer stubs and its resistor has one half the resistance of the outer stubs' resistors.

In addition, by suitable sizing and choice of materials, it is apparent that the microwave equalizer of the present invention could be designed to have practically any characteristic impedance. Further, by selecting the dielectric material in each resonant stub to have a high dielectric constant, and preferably two or more, the shortest possible stubs can be utilized to thereby provide a more compact microwave equalizer. If material having a very high dielectric constant, say 5 or more, were used, even shorter stubs would result. In general, the higher the dielectric constant of the dielectric material utilized in the stubs, the shorter they may be.

From the foregoing, various further applications, modifications and adaptations of the apparatus disclosed by the foregoing preferred embodiments of the present invention will be apparent to those skilled in the art to which the present invention is addressed, within the scope of the following claims.

What is claimed is:

1. In a microwave equalizer of the type which exhibits a frequency band of operation extending between a lower band edge and an upper band edge, and which includes:

(a) a length of transmission line means including at least two coupling points defining a transmission line mid-segment therebetween having a length of approximately one-quarter wavelength of a frequency within the operating frequency band;

(b) at least two absorptive loss means, each conductively coupled to its respective coupling point; and (c) at least two resonant stub line means, each stub line means coupled to its associated absorptive loss means to provide effective coupling of said absorptive loss means to said transmission line means, said stub means having an effective electrical length to selectively disconnect and connect said absorptive loss means from and to said transmission line means at frequencies within said frequency band, a predetermined portion of said transmission line means being partially shunted by said absorptive loss means depending upon the ratio of the magnitudes of the transmission line means predetermined characteristic impedance to that of said absorptive loss means and upon the frequency of the incident microwave energy;

the improvement comprising:

(d) said transmission line means including coaxial transmission line means; and (e) each stub line means comprising flexible coaxial cable stub line means of relatively small diameter, bent so that the entire length thereof is disposed closely adjacent the outer surface of the outer conductor of said transmission line means for compactness and to form a generally cylindrical, capsule-like microwave equalizer.

2. The microwave equalizer of claim 1, wherein each flexible coaxial cable stub line means incorporates a solid dielectric material having a dielectric constant greater than two.

3. In a microwave equalizer of the type which exhibits a frequency band of operation extending between a lower band edge and an upper band edge, and which includes:

(a) a length of transmission line means including at least two coupling points defining a transmission line mid-segment therebetween having a length of approximately one-quarter wavelength of a frequency within the operating frequency band;

(b) at least two absorptive loss means, each conductively coupled to its respective coupling point; and (c) at least two resonant stub line means, each stub line means coupled to its associated absorptive loss means to provide effective coupling of said absorptive loss means to said transmission line means, said stub means having an effective electrical length to selectively disconnect and connect said absorptive loss means from and to said transmission line means at frequencies within said frequency band, a predetermined portion of said transmission line means being partially shunted by said absorptive loss means depending upon the ratio of the magnitudes of the transmission line means predetermined characteristic impedance to that of said absorptive loss means and upon the frequency of the incident microwave energy;

the improvement comprising:

(d) said transmission line means including coaxial transmission line means;

(e) each stub line means including coaxial cable stub line means; wherein a substantial portion of the length of each such coaxial cable stub line means is located adjacent the outer surface of the outer conductor of said transmission line means for compactness and to form a generally cylindrical, capsule-like microwave equalizer;

(f) each said absorptive loss means comprising a film resistor; and (g) retaining means for holding each said film resistor in electrical contact between the center conductor of said coaxial transmission line means and the center conductor of its associated coaxial cable stub line means, each said retaining means including a retaining pin oriented substantially perpendicularly with respect to its respective film resistor.

4. In a microwave equalizer of the type which exhibits a frequency band of operation extending between a lower band edge and an upper band edge, and which includes:

(a) a length of transmission line means including at least two coupling points defining a transmission line mid-segment therebetween having a length of approximately one-quarter wavelength of a frequency within the operating frequency band;

(b) at least two absorptive loss means, each conductively coupled to its respective coupling point; and (c) at least two resonant stub line means, each stub line means coupled to its associated absorptive loss means to provide effective coupling of said absorptive loss means to said transmission line means, said stub means having an effective electrical length to selectively disconnect and connect said absorptive loss means from and to said transmission line means at frequencies within said frequency band, a predetermined portion of said transmission line means being partially shunted by said absorptive loss means depending upon the ratio of the magnitudes of the transmission line means predetermined characteristic impedance to that of said absorptive loss means and upon the frequency of the incident microwave energy;

the improvement comprising:

(d) said transmission line means including coaxial transmission line means;

(e) each stub line means including coaxial cable stub line means; wherein a substantial portion of the length of each such coaxial cable stub line means is located adjacent the outer surface of the outer conductor of said transmission line means for compactness and to form a generally cylindrical, capsule-like microwave equalizer; and (f) recess means in the outer conductor of said coaxial transmission line means, having a radial depth about equal to the diameter of said stub line means, for receiving said substantial portion of the length of each coaxial cable stub line means to protect said coaxial cable stub line means and to provide a more compact microwave equalizer.

5. The microwave equalizer of claim 4, wherein said recess means comprises a generally annular recess defined by a portion of the length of the outer conductor of said coaxial transmission line means having a lesser internal diameter than the internal diameter of the adjacent portions of said outer conductor; wherein said substantial portion of the length of each coaxial cable stub line means is wrapped about said outer conductor within said recess to provide a more compact microwave equalizer; and wherein the dielectric material within said lesser diameter portion of said outer conductor has a dielectric constant less than that of the dielectric material found within said adjacent portions of said outer conductor, to maintain the characteristic impedance of said transmission line means substantially constant along the length thereof.

6. The microwave equalizer of claim 4, wherein when the frequency band thereof is of a relatively high frequency, at least two of said coupling points are located generally adjacent one end of the coaxial transmission line means and at least a portion of said recess means extends generally from said two of said coupling points toward the other end of said coaxial transmission line means.

7. The microwave equalizer of claim 6, wherein said recess means includes at least one generally longitudinal slot receiving said substantial portion of at least one of said coaxial cable stub line means.

8. The microwave equalizer of claim 6, wherein said recess means includes at least one annular recess in which a portion of at least one of said coaxial cable stub line means is received.

9. The microwave equalizer of claim 4, wherein when the frequency band of the equalizer is of a relatively low frequency, said recess means include portions which are located generally between at least two of said coupling points.

10. The microwave equalizer of claim 9, wherein said recess means include at least one generally longitudinally extending slot receiving said substantial portion of at least one of said coaxial cable stub line means.

11. The microwave equalizer of claim 9, wherein said recess means includes at least one annular recess in which a portion of at least one of said coaxial cable stub line means is received.

12. In a microwave equalizer of the type which exhibits a frequency band of operation extending between a lower band edge and an upper band edge, and which includes:

(a) a length of transmission line means including at least two coupling points defining a transmission line mid-segment therebetween having a length of approximately one-quarter wavelength of a frequency within the operating frequency band;

(b) at least two absorptive loss means, each conductively coupled to its respective coupling point; and (c) at least two resonant stub line means, each stub line means coupled to its associated absorptive loss means to provide effective coupling of said absorptive loss means to said transmission line means, said stub means having an effective electrical length to selectively disconnect and connect said absorptive loss means from and to said transmission line means at frequencies within said frequency band, a predetermined portion of said transmission line means being partially shunted by said absorptive loss means depending upon the ratio of the magnitudes of the transmission line means predetermined characteristic impedance to that of said absorptive loss means and upon the frequency of the incident microwave energy;

the improvement comprising:

(d) said transmission line means including coaxial transmission line means with said coupling points and said absorptive loss means being located radially within the outer surface of the outer conductor of said coaxial transmission line means;

(e) each stub line means including coaxial cable stub line means; wherein a substantial portion of the length of each such coaxial cable stub line means is located adjacent the outer surface of the outer conductor of said transmission line means for compactness and to form a generally cylindrical, capsule-like mirowave equalizer; and (f) each said absorptive loss means comprising a thin, flat, film resistor in conductive electrical contact across the center conductor of the coaxial transmission line means and the center conductor of one of the stub line means and each said center conductor being located on one side of the film resistor; and (g) retaining means, each bearing against the other side of its respective film resistor to urge its respective film resistor into the aforesaid conductive electrical contact.

13. In a microwave equalizer of the type which exhibits a frequency band of operation extending between a lower band edge and an upper band edge, and which includes:

(a) a length of transmission line means including at least two coupling points defining a transmission line mid-segment therebetween having a length of approximately one-quarter wavelength of a frequency within the operating frequency band;

(b) at least two film resistors, each conductively coupled to its respective coupling point; and (c) at least two resonant stub line means, each stub line means coupled to its associated film resistor to provide effective coupling of said film resistors to said transmission line means, said stub means having an effective electrical length to selectively disconnect and connect said film resistors from and to said transmission line means at frequencies within said frequency band, a predetermined portion of said transmission line means being partially shunted by said film resistors depending upon the ratio of the magnitudes of the transmission line means predetermined characteristic impedance to that of said film resistors and upon the frequency of the incident microwave energy;

the improvement comprising:

(d) said transmission line means including coaxial transmission line means;

(e) each stub line means including coaxial cable stub line means; each such coaxial cable stub line means being flexible and thus bendable for disposition adjacent the outer surface of said transmission line means for compactness; and (f) retaining means holding each film resistor in electrical contact with the center conductor of said coaxial transmission line means and the center conductor of its associated coaxial cable stub line means, wherein the outer conductor of said coaxial transmission line means includes slot means for receiving the resistor retaining means to thereby provide a more compact microwave equalizer.

* * * * *